United States Patent

Hu et al.

[11] Patent Number: 5,968,594
[45] Date of Patent: Oct. 19, 1999

[54] DIRECT LIQUID INJECTION OF LIQUID AMMONIA SOLUTIONS IN CHEMICAL VAPOR DEPOSITION

[75] Inventors: Jianhua Hu, Cambridge; Paul F. Grosshart, Billerica, both of Mass.

[73] Assignee: Lam Research Corporation, Fremont, Calif.

[21] Appl. No.: 08/673,379

[22] Filed: Jun. 28, 1996

[51] Int. Cl.[6] .................................................. C23C 16/34
[52] U.S. Cl. ..................................... 427/248.1; 427/255.2
[58] Field of Search ........................... 427/248.1, 255.2, 427/576, 590; 423/409, 411

[56] References Cited

U.S. PATENT DOCUMENTS

| | | | |
|---|---|---|---|
| 4,535,000 | 8/1985 | Gordan | 427/160 |
| 5,139,825 | 8/1992 | Gordon et al. | 427/255.2 |
| 5,393,564 | 2/1995 | Westmoreland et al. | 427/248.1 |
| 5,595,784 | 1/1997 | Kaim et al. | 427/255.2 |

FOREIGN PATENT DOCUMENTS 2020264   11/1979   United Kingdom .

OTHER PUBLICATIONS

Eizenberg, M., "Chemical Vapor Deposition of TiN for . . . ", *MRS Bulletin*, Nov. 1995, pp. 38–41.

Goldberg, C. et al., "Low Temperature In–Situ . . . ", *Conference Proceedings ULSI–X*, 1995, Materials Res. Soc., pp. 247–257. (no month).

Fowles, G.W.A. et al., "The Reaction Between Ammonia . . . ", *J. Chem. Soc.*, 2588, 1953, pp. 990–997. (no month).

Raaijmakers, Ivo J., "Low Temperature metal–organic . . . ", *Thin Solid Films*, 247 (1994), pp. 85–93. (no month).

Raaijmakers, Ivo J., "MOCVD–TiN Barrier Layers for . . . ", *Mat., Res. Soc. Symp. Proc.*, 260, 1992, Mat. Res. Soc. pp. 99–105. (no month).

Raaijmakers, Ivo J., et al., "Low Temperature MOCVD of . . . ", *Applied Surface Science*, 73 (1993) pp. 31–41. (no month).

Maya L., "Use of Ammonolytic Intermediates . . . ", *Trans. of Organo. into . . .*, 1988, Martinus Nijhoff Pub., pp. 49–55. (no month).

Kamata, K. et al, "Preparation of titanium . . . ", *Shinku*, 1988, 31(10), pp. 841–844. (abstract) (no month).

*Primary Examiner*—Shrive Beck
*Assistant Examiner*—Timothy Meeks
*Attorney, Agent, or Firm*—Cesari and McKenna, LLP

[57] ABSTRACT

The invention encompasses delivery of reactants for chemical vapor deposition by direct liquid injection of a liquid ammonia solution. In a preferred embodiment, a solution of titanium tetraiodide in liquid ammonia provides reactants for the deposition of titanium nitride.

33 Claims, 2 Drawing Sheets

DIRECT LIQUID INJECTION OF LIQUID AMMONIA SOLUTIONS IN CHEMICAL VAPOR DEPOSITION

FIELD OF THE INVENTION

This invention relates to chemical vapor deposition of thin films. Particularly, this invention relates to methods and apparatus for direct injection of liquid ammonia solutions in deposition processes, especially for depositing titanium nitride.

BACKGROUND OF THE INVENTION

The physical and chemical properties of titanium nitride, namely its high electrical conductivity, hardness, melting point and thermal and chemical stability have made it a material of choice for diffusion barrier layers in the manufacture of semiconductor devices. A major challenge in adapting titanium nitride films to sub-half-micron generation ultra-large-scale-integrated ("ULSI") circuit technologies is the synthesis of continuous layers conformal to holes and trenches of sub-quarter-micron diameter in the substrate, corresponding to aspect ratios equal to or greater than 4:1. Such deposition is especially difficult to achieve using lower processing temperatures, such as might be desirable for compatibility with polymer dielectric layers, for example.

Physical vapor deposition ("PVD") techniques, which place the elemental constituents of a deposit onto a substrate, have provided layers satisfactory for very-large-scale-integrated ("VLSI") circuitry. PVD, such as by sputtering, of titanium nitride can be accomplished at temperatures well below 250° C. However, the resulting layer typically has several deficiencies. The most problematic flaw is the poor conformity of the layer to deep and narrow trenches, which renders it unreliable for protection of ULSI contacts from the thermal and chemical rigors of subsequent processing steps.

In chemical vapor deposition ("CVD") techniques, species in the vapor phase over the substrate react to form the deposit on the substrate, often with plasma enhancement. These techniques provide superior coverage of complex topographies, but they generally require higher, sometimes unacceptably high, substrate temperatures during deposition. A variety of organic and inorganic CVD chemistries have been applied to the deposition of titanium nitride. One of the more common of such CVD processes uses a gaseous reactant mixture containing titanium tetrachloride and ammonia. The production of acceptable films from this chemistry typically requires substrate temperatures in excess of 600° C., too high to be universally appropriate for all metallization levels. A lower-temperature variation with titanium tetrabromide still requires a minimum substrate temperature of 400° C.

Thermodynamic calculations indicate that deposition of titanium nitride from a reactant gas mixture of titanium tetraiodide and ammonia could occur at substrate temperatures lower than 300° C. Titanium nitride films have been produced from these reactants in plasma-enhanced CVD processes. (See, e.g., Goldberg et al., pp. 247–257, *Advanced Metallization for ULSI Applications in* 1994, Blumental et al., eds., Materials Research Society [1995] and Kamata et al., *Shinku,* Vol. 31, pp. 841–844 [1988].) Reports of this process have described the incorporation of hydrogen in the reactant gas mixture. The hydrogen serves as a carrier gas for the other reactants and is also believed to act as a reducing agent and to prevent the recombination of titanium and iodine species liberated by the thermal decomposition of titanium tetraiodide.

The reported deposition reaction for this chemistry is $$2TiI_{4(g)}+2NH_{3(g)}+H_{2(g)} \rightarrow 2TiN_{(s)}+8HI_{(g)},$$

which has a negative Gibbs free energy at temperatures greater than about 283°0 C. However, the properties of titanium tetraiodide preclude its straightforward substitution into an analogous process using lighter halides. Difficulty in delivering titanium tetraiodide into the process chamber presents a significant hindrance to efficient deposition of titanium nitride from this chemistry. The melting point of titanium tetraiodide is about 150° C. At this temperature, the vapor pressure of titanium tetraiodide is only about 1.3 Torr, so that its efficient incorporation into a carrier gas is problematic; this difficulty, in turn, limits the rate at which the tetraiodide can be delivered to the deposition site. Maintaining the transport pathway at an elevated temperature, a common tactic for such nonvolatile reactants, does not enhance the rate of tetraiodide delivery. If heated much above the melting point, titanium tetraiodide partially converts to the triiodide and the diiodide, both of which have even lower vapor pressures than does the tetraiodide.

An alternative to gas-phase transport available for nonvolatile or heat-sensitive reactants is conveyance of the reactant in a liquid state into or into the vicinity of the deposition chamber, and only thereafter volatilizing the reactant. This technique has been used to deposit nitrides from some low-vapor-pressure organometallic titanium compounds. However, the introduction of pure titanium tetraiodide by this direct liquid injection technique would be hindered by its high melting point. Another approach that has been used for reactants having similar problematic physical properties is the injection of a liquid carrier solvent containing the dissolved reactant into the deposition chamber, where both solvent and reactant enter the vapor phase near the substrate upon exposure to the elevated processing temperature. However, finding an appropriate solvent, giving an adequate solubility without the introduction of deleterious contaminants, for a given reactant is not completely straightforward. For example, conventional direct-liquid-injection solvents, such as hydrocarbons or chlorinated hydrocarbons, do not dissolve titanium tetraiodide. Carbon disulfide does dissolve titanium tetraiodide to some extent. However, the reaction of carbon disulfide with ammonia at CVD process temperatures would form byproducts that would be incorporated into the final film product as undesirable impurities.

DESCRIPTION OF THE INVENTION

Brief Summary of the Invention

The invention uses direct liquid injection of a liquid ammonia solution to introduce a deposition reactant into a CVD deposition chamber. The solution is produced outside the deposition chamber and transported to the chamber under temperature and pressure conditions appropriate for maintaining the solution in a liquid state until injection. For the purposes of this disclosure, the term "solution" refers to any multicomponent homogeneous single-phase liquid, regardless of the relative concentrations or states of aggregation, complexing or bonding of the components in the liquid; a solution of a given component in ammonia refers to a mixture formed by combining the component, or some compound containing the component, with ammonia, or example by dissolving the component or a component-containing compound in liquid ammonia; a mixture containing species obtainable by combining the component or a component-containing compound with ammonia; or a mixture containing the component and ammonia. In the deposition chamber, the solution evaporates, releasing one or more constituents, which provide reactant species from which the layer is deposited, into the vapor phase over the substrate. A constituent may function as a reactant species directly, in the form which it was released, or it may undergo decomposition or other transformation in the vapor phase before actually participating in the ultimate deposition reaction. The liquid solution serves as a vehicle to transport reactant material to the deposition chamber. For some chemistries, the primary function of the ammonia is to provide a solution medium, so the ammonia is largely removed from the chamber after volatilization; for other chemistries, however, ammonia is also a principal participant after vaporization in the overall reaction that forms the desired compound on the substrate.

Although the subambient normal liquid range of ammonia (boiling point: −33.7° C.) requires additional instrumentation and unconventional constraints on the direct-liquid injection apparatus, it affords a notable expansion of the chemistries accessible using direct liquid injection techniques. Liquid ammonia is a versatile solvent which dissolves a wide variety of organic and inorganic compounds, some of which are insoluble in some previously known direct-liquid-injection solvents. Also unlike some conventionally used solvents, ammonia does not contain carbon, chlorine, or sulfur, any of which may be objectionable for some deposition products. For some nitrogen-containing layers in particular, ammonia is actually part of the preferred deposition chemistry and would have to be provided to the vapor phase by another route if not by liquid injection.

The liquid-ammonia direct-liquid-injection approach of the present invention is particularly advantageous in the deposit of titanium nitride. In a preferred embodiment, the invention provides titanium iodide, preferably the tetraiodide, to the CVD deposition chamber by direct liquid injection of a liquid solution formed by dissolving titanium tetraiodide in liquid ammonia. Titanium tetraiodide is readily soluble in liquid ammonia. The liquid solution is maintained in a condensed state after formation of the solution and before its injection into the reaction chamber.

The direct liquid injection of a titanium tetraiodide/liquid ammonia solution efficiently delivers two constituents sufficient for titanium nitride deposition, titanium tetraiodide and ammonia, to the reaction chamber where they enter the vapor phase over the substrate, react, and deposit the film. Thus, the complete reaction environment may be provided without a separate gas flow pathway, and its attendant regulation apparatus, for the introduction of the ammonia. The invention eliminates completely the need for ancillary species—whether in a carrier gas or a liquid solvent—gratuitous to the chemistry of the actual deposition, thereby limiting the introduction of impurities into the final product. The omission of hydrogen gas from the reactant mixture is also desirable because in the absence of hydrogen gas, deposit of titanium nitride by the tetraiodide/ammonia reaction becomes thermodynamically possible at lower temperatures. Also, the relatively low temperatures at which the tetraiodide/ammonia solution is maintained before introduction into the reaction chamber inhibits tetraiodide disproportionation to lower-vapor-pressure species.

Thus, in one or more of its embodiments, the invention provides a relatively simple process for making CVD titanium nitride having low contaminant levels using low substrate temperatures and without the need for plasma enhancement.

BRIEF DESCRIPTION OF THE DRAWINGS

The foregoing discussion will be understood more readily from the following detailed description of the invention, when taken in conjunction with the accompanying drawings.

It will be appreciated that, for purposes of illustration, these figures are not necessarily drawn to scale.

DETAILED DESCRIPTION OF THE INVENTION

Figure 1:
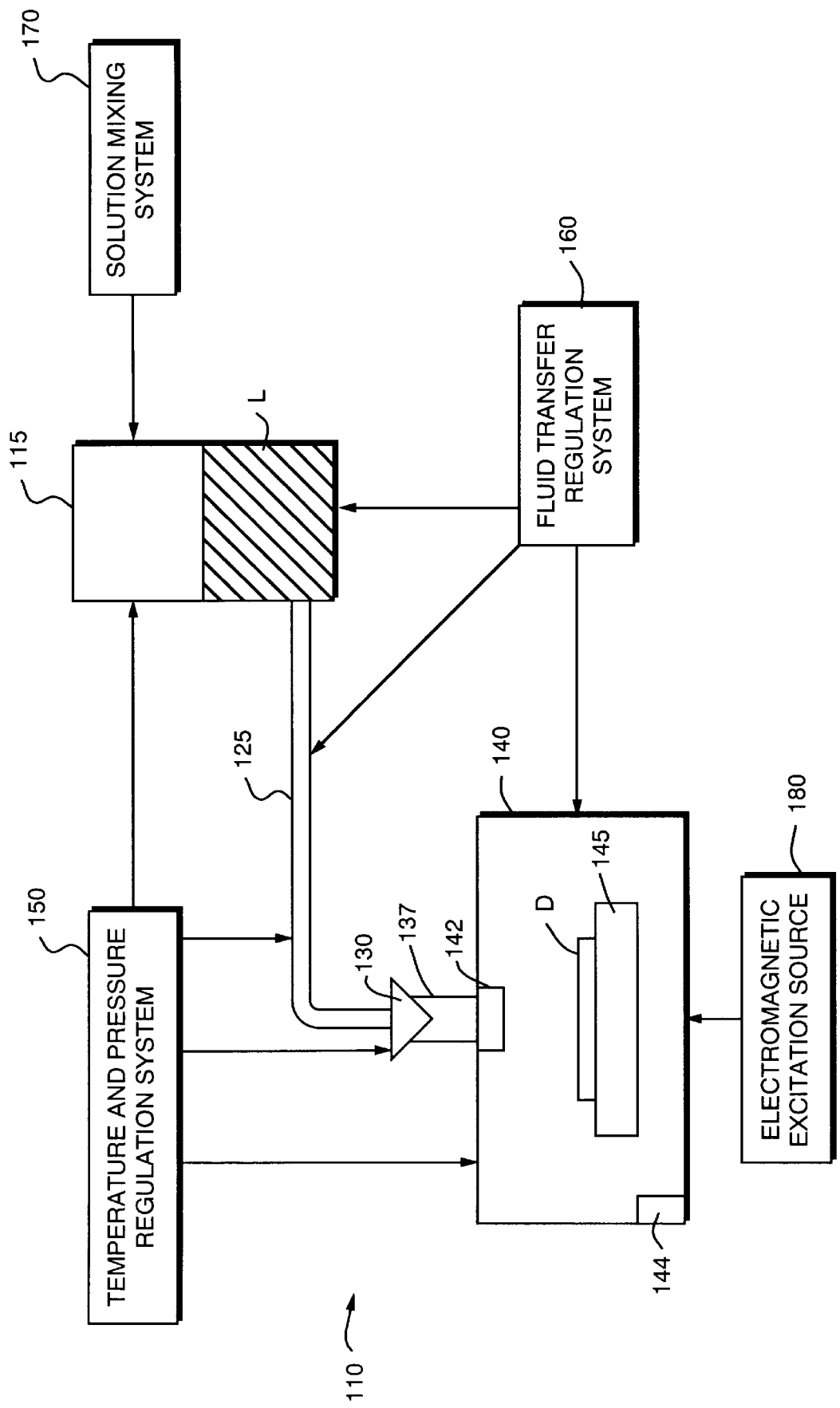
FIG. 1 schematically illustrates a chemical vapor deposition system in accordance with the present invention.

With reference to FIG. 1, a chemical vapor deposition system according to the invention, generally designated at 110, includes a solution container 115, containing a liquid ammonia solution L made by dissolving at least one solute in liquid ammonia. A vaporization head 130 is in fluid communication with the container through a conduit 125. A CVD reaction chamber 140, housing a holder 145 for at least one deposition substrate D (for example, a semiconductor wafer such as silicon), has a gas inlet port 142 and a gas outlet port 144. The location of the vaporization head 130 with respect to the gas inlet port 142 is not critical to the function of the invention. It is acceptably located outside the reaction chamber 140 proper and joined thereto by a conduit 137 as shown, in which case the conduit 137 may be considered to be part of the reaction chamber 140; alternatively it is inside the reaction chamber 140 proper. The placement of the ports 142 and 144 are chosen to provide the optimal gas flow pathway through the chamber 140.

A temperature and pressure regulation system 150 (described in greater detail below) is coupled to various elements of the system 110 to maintain respective values of temperature and/or pressure compatible with the desired state of the liquid ammonia solution in those elements. The system 150 operates so as to maintain the solution in a liquid state in the container 115 and throughout the apparatus joining the container 115 to the vaporization head 130, thereby avoiding disintegration of the solution with unwanted precipitation of solute inside the system 110 At standard pressure, ammonia is a liquid at temperatures lower than −33.7° C. A liquid ammonia solution generally boils at a somewhat higher temperature, depending on the concentration of the dissolved substance. At room temperature, ammonia exists in a condensed state at pressures greater than about ten atmospheres. A wide spectrum of reduced temperature/elevated pressure combinations are available for keeping the solution intact. For example, the temperature and pressure regulation system 150 may maintain the portion of the system between the solution container 115 and the vaporization head 130 at a temperature no greater than 50° C., preferably so that at least some portion is at a temperature not greater than 0° C. or even in some cases not greater than −25° C. The regulation system 150 need not provide a uniform environment from the container 115 to the vaporization head 130, so long as it maintains conditions at which liquid ammonia does not leave the solution before the solution reaches the vaporization head 130. At the conversion head 130, the system 150 imposes relatively reduced pressure and/or elevated temperature values, with respect to those applied to the conduit 125, to allow vaporization of the solution.

The system 150 also functions to provide an environment conducive to the deposition process in the deposition chamber 140, especially the deposition substrate D and the region immediately above it. Substrate temperatures are generally chosen from a range bounded by 0° C. and 600° C., although temperatures outside this range may be preferred for some applications. For most reactions, a substrate temperature of at least 300° C. is required. Other regions of the chamber 140 such as the chamber walls are generally held at sufficiently low temperatures to inhibit secondary deposition.

The temperature and pressure regulation system 150 is configured according to any of the many arrangements known to those skilled in the art and generally includes any or all of an automatic controller, pressure and temperature sensors, a vacuum source, a refrigeration source, a heat source, vacuum or coolant jacketing around the solution container 115 and the conduit 125. The pressure and temperature sensors provide feedback to the automatic controller to enable it to operate other elements of the system 150 to establish and maintain temperature and pressure values in accordance with respective preselected setpoint values.

An optional mass transfer regulation system 160 regulates the movement of liquid ammonia solution liquid from the container 115 to the vaporization head 130, of process gases into the deposition chamber 140 to the substrate D, and of effluent out the gas outlet port 144. Generally, the mass transfer system 160 includes any or all of a fluid pump, a vacuum pump, valves that enable isolation of various elements of the system 110 from one another, and a gas diffuser to create the optimum gas flow pattern in the deposition chamber 140. The mass transfer system may be configured also to provide inert species, additional gaseous reactants or supplemental ammonia to the chamber 140.

An optional solution mixing system 170 produces the liquid ammonia solution provided by the container 115. Such a mixing system 170 generally includes a supply of gaseous or liquid ammonia in fluid communication with the solution container 115. The mixing system 170 incorporates means for transferring ammonia from the supply into the container 115 on demand for mixing with solute. Stirring means, such as an externally actuated magnetic stirrer, are optionally included to ensure complete dissolution of the solute and homogeneity of the solution.

An optional electromagnetic excitation source 180 such as a radio-frequency generator is coupled to the reaction chamber 140 so as to provide energy to gaseous species near the substrate D. The energy provided enhances the reactivity of the gaseous species by creating ions or excited neutral species. Such plasma enhancement for CVD systems is well known in the art.

In operation, liquid L moves from the solution container 115, through the conduit 125, and to the vaporization head 130, where, due to relatively reduced pressure and/or elevated temperature, the liquid undergoes at least partial vaporization. The vapor and any unvaporized liquid droplets enter the reaction chamber 140. The vaporized solution contributes at least one constituent such as the solute or some species formed from the solute in solution to the vapor in the vicinity of the deposition substrate D. The one or more constituents, which may or may not include ammonia, participate in the overall reaction that deposits the desired layer onto the substrate D. Reaction products and excess reactants leave the chamber 140 through the gas outlet port 144 for scrubbing or dilution.

Figure 2:
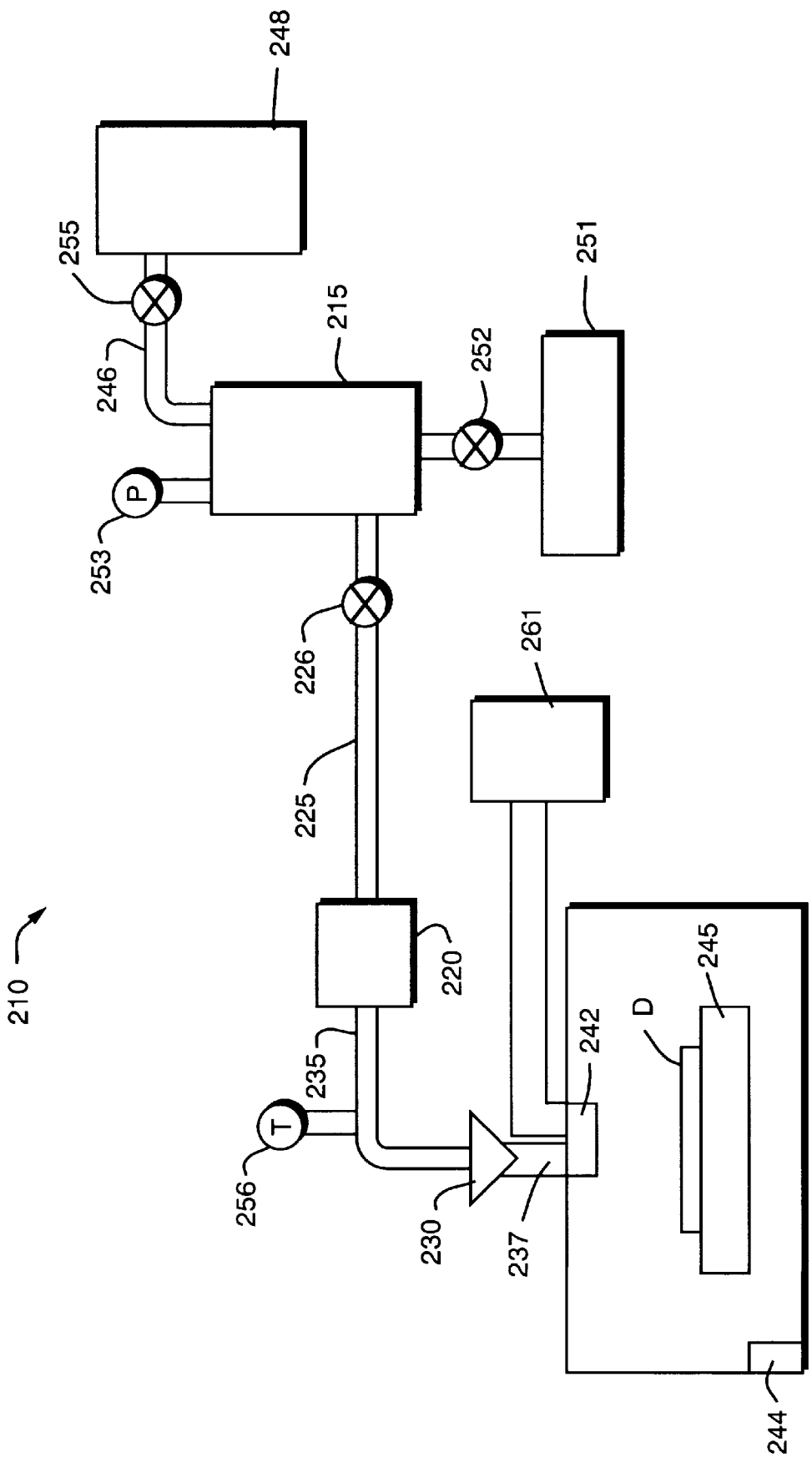
FIG. 2 schematically illustrates a chemical vapor deposition system made in accordance with the invention, specifically adapted for titanium nitride deposition.

With reference to FIG. 2, a preferred embodiment of the CVD system of the invention, specifically adapted for deposition of titanium nitride, is generally designated at 210. A conduit 225 joins a solution vessel 215 for containing titanium tetraiodide-ammonia solution to a liquid pump 220 through a valve 226. A conduit 235 joins the pump 220 to a vaporization head 230. The outlet side of the vaporization head 230 is joined to a gas inlet port 242 of a CVD reaction chamber 240 by a conduit 237. The reaction chamber 240 houses a holder 245 for at least one deposition substrate D.

A vacuum source 251 is joined to the vessel 215 through vacuum valve 252 to enable evacuation of the vessel 215 in preparation of mixing the liquid ammonia solution. The vessel 215 is in fluid communication through a conduit 246 with a tank 248 containing ammonia. A conventional regulator on the tank 248 allows adjustment of the pressure at which ammonia is delivered into the conduit 220. A pressure gauge 253 is positioned to sense the pressure in the vessel 215. An ammonia valve 255 on the conduit 246 allows control of ammonia transfer from the tank 249 to the vessel 215.

To form tetraiodide-ammonia solution, with the valves 226, 252, and 255 closed, the vessel 215 is opened and loaded with a desired mass of titanium tetraiodide crystals. After closing the vessel 215, the vacuum valve 252 is opened to allow the pump 251 to evacuate the vessel 215. After the vacuum valve 252 is closed, the ammonia valve 255 is opened to allow transfer of ammonia from the tank 225 into the vessel 215 at a delivery pressure of at least 150 psi. Under the elevated pressure, ammonia condenses in the vessel 215 and forms a solution with the tetraiodide. When the desired mass of ammonia has been transferred into the vessel 215, the ammonia valve 255 is closed.

To deposit titanium nitride, with the valve 226 open, the action of the pump 220 moves tetraiodide-ammonia solution in its liquid state from the vessel 215. As liquid solution leaves the conduit 225, a small amount of liquid ammonia evaporates to maintain the solution in the vessel 215 and the conduit 225 at a pressure adequate for maintaining the titanium tetraiodide-ammonia solution in a condensed state. The pump rate is chosen so as to provide reactants to the deposition chamber 240 at the optimum rate for the reaction conditions.

Solution exiting the pump 220 into the conduit 235 is under about 100 psi of pressure. The conduit 235 is chilled to a temperature less than −35° C. by the circulation of a refrigerant through tubing coiled about the conduit 235. A temperature sensor 256 senses the temperature of the solution in the conduit 235 for adjustment of the flow rate of refrigerant through the tubing.

The conduit 235 conveys solution to the vaporization head 230. In passing through the vaporization head 230, the solution experiences a decrease in pressure and an increase in temperature that causes it to undergo at least partial vaporization, thereby releasing gaseous ammonia and gaseous titanium tetraiodide. The vapor and any remaining liquid droplets pass through the conduit 237 and enter the process chamber 240. An ammonia source 261 in communication with the inlet port 242 provides gaseous ammonia to the deposition chamber 240 for fine adjustment of the composition of the vapor near the substrate D.

At a sufficiently high temperature, ammonia and titanium tetraiodide react to form titanium nitride. The reaction $$6TiI_{4(g)} + 8NH_{3(g)} \rightarrow 6TiN_{(s)} + 24HI_{(g)} + N_{2(g)}$$

is thermodynamically possible at temperatures greater than 268° C. However, the reaction rate improves with increasing temperature of the substrate D. To achieve a cost-effective reaction rate, the substrate is preferably maintained at a temperature greater than 300° C. In order to comply with thermal budget considerations, the substrate is preferably maintained at a temperature less than 600° C. Most preferably, for titanium nitride deposition the substrate temperature is held between 350° C. and 450° C. Effluent leaves the deposition chamber 240 through the gas outlet port 244.

It will therefore be seen that the foregoing represents a highly advantageous approach to direct liquid injection in CVD processing, especially for the deposition of titanium nitride layers. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of forming titanium nitride, the method comprising the steps of:
   a. providing a liquid solution of titanium iodide in ammonia;
   b. vaporizing the liquid solution, thereby forming gaseous constituents;
   c. providing the gaseous constituents to a deposition chamber housing a substrate at a substrate temperature no greater than 500° C., thereby forming titanium nitride.

2. The method of claim 1 wherein the titanium iodide is titanium tetraiodide.

3. The method of claim 1 wherein the step of providing the liquid solution includes dissolving titanium iodide in liquid ammonia at a solution location and the step of vaporizing the liquid solution occurs at a vaporization location and further comprising the step of transporting the liquid solution from the solution location to the vaporization location over a transport pathway maintained at temperature and pressure conditions under which the liquid solution is stable.

4. The method of claim 3 wherein the titanium nitride forms as a film on the substrate.

5. The method of claim 3 wherein no portion of the transport pathway is at a temperature greater than 50° C.

6. The method of claim 3 wherein at least some portion of the transport pathway is at a temperature no greater than 0° C.

7. The method of claim 3 wherein at least some portion of the transport pathway is at a temperature no greater than −25° C.

8. The method of claim 1 wherein the gaseous constituents are heated to a reaction temperature no greater than 450° C.

9. The method of claim 1 wherein the gaseous constituents are heated to a reaction temperature no greater than 400° C.

10. The method of claim 1 wherein the gaseous constituents are heated to a reaction temperature no greater than 350° C.

11. The method of claim 1 wherein the titanium nitride forms as a film on the substrate.

12. The method of claim 1 wherein the gaseous constituents include titanium tetraiodide and ammonia.

13. A method for depositing a titanium nitride film onto a substrate by chemical vapor deposition, the method comprising the steps of:
    a. providing a liquid solution of titanium tetraiodide in ammonia;
    b. vaporizing the liquid solution, thereby forming gaseous constituents;
    c. providing the gaseous constituents to a deposition chamber housing the substrate at a substrate temperature no greater than 500° C., thereby forming the titanium nitride film.

14. The method of claim 13 wherein the substrate temperature is no greater than 450° C.

15. The method of claim 13 wherein the substrate temperature is no greater than 400° C.

16. The method of claim 13 wherein the substrate temperature is no greater than 350° C.

17. The method of claim 13 wherein the step of providing the liquid solution includes dissolving titanium tetraiodide in liquid ammonia at a solution location and the step of vaporizing the liquid solution occurs at a vaporization location and further comprising the step of transporting the liquid solution from the solution location to the vaporization location over a transport pathway maintained at temperature and pressure conditions under which the liquid solution is stable.

18. The method of claim 17 wherein no portion of the transport pathway is at a temperature greater than 50° C.

19. The method of claim 17 wherein at least some portion of the transport pathway is at a temperature no greater than 0° C.

20. The method of claim 17 wherein at least some portion of the transport pathway is at a temperature no greater than −25° C.

21. The method of claim 13 wherein the gaseous constituents include titanium tetraiodide and ammonia.

22. A method for depositing a titanium nitride film onto a substrate by chemical vapor deposition, the method comprising the steps of:
    a. providing a liquid solution of titanium tetraiodide in ammonia;
    b. vaporizing the liquid solution, thereby forming gaseous constituents;
    c. providing the gaseous constituents to a deposition chamber housing the substrate at a substrate temperature no greater than 400° C., thereby forming the titanium nitride film.

23. The method of claim 22 wherein the gaseous constituents include titanium tetraiodide and ammonia.

24. The method of claim 22 wherein the step of providing the liquid solution includes dissolving titanium tetraiodide in liquid ammonia at a solution location and the step of vaporizing the liquid solution occurs at a vaporization location and further comprising the step of transporting the liquid solution from the solution location to the vaporization location over a transport pathway maintained at temperature and pressure conditions under which the liquid solution is stable.

25. The method of claim 24 wherein no portion of the transport pathway is at a temperature greater than 50° C.

26. The method of claim 24 wherein at least some portion of the transport pathway is at a temperature no greater than 0° C.

27. The method of claim 24 wherein at least some portion of the transport pathway is at a temperature no greater than −25° C.

28. A method for depositing a titanium nitride film onto a substrate by chemical vapor deposition, the method comprising the steps of:
    a. providing a liquid solution of titanium tetraiodide in ammonia;
    b. vaporizing the liquid solution, thereby forming gaseous constituents;

c. providing the gaseous constituents to a deposition chamber housing the substrate at a substrate temperature no greater then 350° C., thereby forming the titanium nitride film.

29. The method of claim 28 wherein the gaseous constituents include titanium tetraiodide and ammonia.

30. The method of claim 28 wherein the step of providing the liquid solution includes dissolving titanium tetraiodide in liquid ammonia at a solution location and the step of vaporizing the liquid solution occurs at a vaporization location and further comprising the step of transporting the liquid solution from the solution location to the vaporization location over a transport pathway maintained at temperature and pressure conditions under which the liquid solution is stable.

31. The method of claim 30 wherein no portion of the transport pathway is at a temperature greater than 50° C.

32. The method of claim 30 wherein at least some portion of the transport pathway is at a temperature no greater than 0° C.

33. The method of claim 30 wherein at least some portion of the transport pathway is at a temperature no greater than −25° C.

* * * * *